(12) United States Patent
Fischer et al.

(10) Patent No.: US 10,720,472 B2
(45) Date of Patent: Jul. 21, 2020

(54) X-RAY IMAGE SENSOR WITH ADHESION PROMOTIVE INTERLAYER AND SOFT-SINTERED PEROVSKITE ACTIVE LAYER

(71) Applicant: Siemens Healthcare GmbH, Erlangen (DE)

(72) Inventors: Rene Fischer, Erlangen (DE); Alberto Gregori, Erlangen (DE); Judith Elisabeth Huerdler, Nuremberg (DE); Cindy Montenegro Benavides, Erlangen (DE); Sandro Francesco Tedde, Weisendorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/163,742

(22) Filed: Oct. 18, 2018

(65) Prior Publication Data

US 2019/0123110 A1    Apr. 25, 2019

(30) Foreign Application Priority Data

Oct. 20, 2017   (EP) .................................... 17197622

(51) Int. Cl.
*H01L 27/30*   (2006.01)
*G01T 1/24*    (2006.01)
(Continued)

(52) U.S. Cl.
CPC ............ *H01L 27/308* (2013.01); *G01T 1/241* (2013.01); *H01L 31/0224* (2013.01);
(Continued)

(58) Field of Classification Search
CPC ................ H01L 27/308; H01L 27/146; H01L 27/14605; H01L 27/14683; H01L 51/4273;
(Continued)

(56) References Cited

U.S. PATENT DOCUMENTS

| 10,263,043 B2 | 4/2019 | Fischer et al. |
| 2008/0032221 A1* | 2/2008 | Lin ........................ G03G 5/142 430/58.65 |

(Continued)

FOREIGN PATENT DOCUMENTS

| CN | 106129416 A | 11/2016 |
| DE | 102015225145 A1 | 6/2017 |

(Continued)

OTHER PUBLICATIONS

European Search Report dated Apr. 13, 2018, for Application No. 17197622.8.
(Continued)

*Primary Examiner* — Dao H Nguyen
(74) *Attorney, Agent, or Firm* — Schiff Hardin LLP

(57) ABSTRACT

An X-ray detector, particularly a pixelated flat panel X-Ray detector using semiconducting perovskites as direct converting layer, has a top electrode, a photoactive layer containing at least one perovskite, and a bottom electrode, wherein the X-ray detector additionally has an electron blocking interlayer and/or a hole blocking interlayer containing an adhesion promoting additive, which can be one or more of saccharides and derivatives thereof, amino resins, epoxy resins, natural resins, and acrylic based adhesives.

23 Claims, 6 Drawing Sheets

(51) Int. Cl.
H01L 31/0224 (2006.01)
H01L 31/08 (2006.01)
H01L 51/42 (2006.01)
H01L 51/00 (2006.01)

(52) U.S. Cl.
CPC ........ *H01L 31/085* (2013.01); *H01L 51/4273* (2013.01); *H01L 51/0026* (2013.01); *H01L 51/0037* (2013.01)

(58) Field of Classification Search
CPC ............. H01L 51/0026; H01L 51/0037; H01L 31/0224; H01L 31/085; G01T 1/241
USPC ................ 257/288, 88, 79, 40, 21, E31.003, 257/E31.013, E51.018, E51.012; 438/46, 438/57, 82, 94, 99; 430/58.65, 58.7, 430/58.75, 59.1, 59.4; 136/252, 256, 263
See application file for complete search history.

(56) References Cited

U.S. PATENT DOCUMENTS

| | | | |
|---|---|---|---|
| 2012/0138140 | A1 | 6/2012 | Kihara et al. |
| 2015/0249170 | A1* | 9/2015 | Snaith .................. H01L 51/422 136/256 |
| 2015/0295194 | A1* | 10/2015 | Kanatzidis ......... H01L 51/0032 136/263 |
| 2017/0170412 | A1 | 6/2017 | Kanitz et al. |
| 2017/0293037 | A1 | 10/2017 | Schmidt et al. |
| 2017/0294595 | A1* | 10/2017 | Kim ...................... H01L 51/005 |
| 2017/0322323 | A1 | 11/2017 | Fischer et al. |
| 2018/0166504 | A1* | 6/2018 | Kamino ................ H01L 51/447 |
| 2018/0240848 | A1 | 8/2018 | Heo et al. |

FOREIGN PATENT DOCUMENTS

| | | |
|---|---|---|
| EP | 2803913 A1 | 11/2014 |
| EP | 2808913 A1 | 12/2014 |
| KR | 20170029370 A | 3/2017 |
| WO | 2016091442 A1 | 6/2016 |
| WO | 2016091600 A1 | 6/2016 |
| WO | 2016146612 A1 | 9/2016 |
| WO | 2017082081 A1 | 5/2017 |

OTHER PUBLICATIONS

J. Ouyang et al: "Conducting Polymer as Transparent Electric Glue", Advanced Materials, vol. 18, No. 16, Aug. 18, 2006 (Aug. 18, 2006), pp. 2141-2144, XP55014412.

Yong Churl Kim et al: "Printable organometallic perovskite enables large-area, low-dose X-ray imaging", Nature, vol. 550, No. 7674, Oct. 5, 2017 (Oct. 5, 2017), pp. 87-91, XP055463743.

Lascaux Colours & Restauro "Lascaux Adhesives and Adhesive Wax"; Jan. 26, 2018; http://en.lascaux.ch/lascaux.ch/pdf/en/produkte/restauro/58370.02_Adhesive_and_Adhesive_Wax.pdf.

Shrestha, Shreetu et al. "High-performance direct conversion X-ray detectors based on sintered hybrid lead triiodide perovskite wafers" Nature Photonics, Jun. 2017 | DOI: 10.1038/NPHOTON.2017.94.

Havare, Ali Kemal et al. "The performance of OLEDs based on sorbitol doped PEDOT:PSS" Synthetic Metals, 2011, DOI: 10.1016/j.synthmet.2011.10.011.

Nardes, A.M. et al. "Conductivity, work function, and environmental stability of PEDOT:PSS thin films treated with sorbitol" Organic Electronics, vol. 9, pp. 727-734, 2008; doi:10.1016/j.orgel.2008.05.006.

Isakova, Anna et al. "Polymer Strategies in Perovskite Solar Cells" Journal of Polymer Science, Part B: Polymer Physics, vol. 55, pp. 549-568, 2017; DOI: 10.1002/polb.24301.

Wei, Haotong et al. "Sensitive X-ray detectors made of methylammonium lead tribromide perovskite single crystals" Nature Photonics, Mar. 2016, pp. 1-8, DOI: 10.1038/NPHOTON.2016.41.

Yakunin, Sergii et al. "Detection of X-ray photons by solution-processed organic-inorganic-perovskites" Nature Photonics, May 2015; pp. 1-18; ISSN 1749-4885.

Zhang, Fengling et al. "Polymer Photovoltaic Cells with Conducting Polymer Anodes" Advanced Materials, vol. 14, No. 9, pp. 662-665, 2002.

Sun, Kuan et al. "Review on application of PEDOTs and PEDOT:PSS in energy conversion and storage devices" Journal of Materials Science Materials in Electronics, Mar. 2015, DOI 10.1007/s10854-015-2895-5.

Huang, Jinsong et al. "A Semi-transparent Plastic Solar Cell Fabricated by a Lamination Process" Advanced Materials, vol. 20, pp. 415-419, 2008; DOI: 10.1002/adma200701101.

Makha, Mohammed et al. "A transparent, solvent-free laminated top electrode for perovskite solar cells" Science and Technology of Advanced Materials, vol. 17, No. 1, pp. 260-266, 2016; http://dx.doi.org/10.1080/14686996.2016.1176512.

Bryant, Daniel et al. "A Transparent Conductive Adhesive Laminate Electrode for High-Efficiency Organic-Inorganic Lead Halide Perovskite Solar Cells" Advanced Materials, vol. 26, pp. 7499-7504, 2014; DOI: 10.1002/adma.201403939.

Korean Decision to Grant dated May 27, 2020, Application No. 10-2018-0123497.

* cited by examiner

*Prior Art*

X-RAY IMAGE SENSOR WITH ADHESION PROMOTIVE INTERLAYER AND SOFT-SINTERED PEROVSKITE ACTIVE LAYER

BACKGROUND OF THE INVENTION

Field of the Invention

The present invention relates to an X-ray detector, particularly a pixelated flat panel X-Ray detector of the type using semiconducting perovskites as the directly converting layer, and having a top electrode, a photoactive layer containing at least one perovskite, and a bottom electrode, wherein the X-ray detector additionally has an electron blocking interlayer and/or a hole blocking interlayer containing an adhesion promoting additive, as well as a method of manufacturing such an X-ray detector.

Description of the Prior Art

Digital X-ray detectors find various applications in medical diagnostics, and are usually supplied in sizes between 20×20 cm$^2$ and 43×43 cm$^2$. Current state of the art detectors are based on amorphous silicon (indirect conversion) and amorphous selenium (direct conversion).

For direct conversion, X-ray quanta excite (release) a particle, which results in a formation of electron/hole pairs. These can then migrate to electrodes, as soon as an electrical field is applied, where they can be detected. Direct conversion of X-rays in selenium is usually carried out with up to 1 mm thick layers which are pre-charged in a blocking direction in the kV-range. In contrast to indirect converting detectors, which can be produced more easily and more cheaply, direct converters normally show an increased resolution.

For indirect conversion, X-ray quanta excite a scintillating material (e.g. CsI:Tl, thallium doped cesium iodide, or terbium doped gadolinium oxysulfide), which results in the formation of visible photons. These can then migrate to a photodetector, which may be a stacked array made of e.g. a-Si photodiodes, which are responsible for the photon-to-charge conversion. As soon as an electrical field is applied, these charges can be detected at the photodetector electrodes.

An alternative to the two above-mentioned X-ray detector technologies, which are based on inorganic semiconductors, are hybrid-organic detectors that usually are produced from the liquid or powder phase. These enable an easy fabrication in sizes of up to 43×43 cm$^2$ and more. Usually, inorganic absorber materials like quantum dots or scintillator material particles like e.g. gadolinium oxysulfide are introduced into the organic matrix. Organic semiconductors can be easily applied on large surfaces from the liquid or powder phase and optical cross-talk can be minimized by directly introducing the inorganic scintillator material. Today, hybrid X-Ray detectors are not yet present on the market. Due to the isotropic emission of light in the scintillator, indirect converters usually suffer of poor resolution in comparison to direct converters.

Direct converting X-ray detectors are usually produced either by growing the active material directly on the backplane, e. g. a-Se by PECVD (plasma-enhanced chemical vapor deposition) or by bump-bonding the active material on top of the backplane, e. g. CdTe or CZT (cadmium zinc telluride). Neither method exhibits adhesion problems, but these techniques are expensive and time consuming. Commonly used starting materials are also expensive and, in the case of crystalline material, are limited to the maximum wafer size, unless abutment of smaller wafers is used.

In this regard, semiconducting perovskites are emerging as low cost materials for photovoltaics (PV), lasers, LED and X-ray detection, as disclosed in e.g. H. Wei et al., "Sensitive X-ray detectors made of methylammonium lead tribromide perovskite single crystals", Nature Photonics 10, 2016, pp. 333-339, doi:10.1038/nphoton.2016.41; S. Shrestha et al., "High-performance direct conversion X-ray detectors based on sintered hybrid lead triiodide perovskite wafers", Nature Photonics 11, 2017, pp. 436-440, doi: 10.1038/nphoton.2017.94; and S. Yakunin et al., "Detection of X-ray photons by solution-processed lead halide perovskites", Nature Photonics 9, 2015, pp. 444-449 doi: 10.1038/nphoton.2015.82.

Further, for thin film (few hundreds of nanometers, but below 1 μm) organic photovoltaics (OPVs), organic light-emitting diodes (OLEDs), and perovskite photovoltaics (PVs) the combination of PEDOT and sorbitol has been reported as adhesion promoting electrode in combination with laminating processes, as e.g. described in J. Ouyang, Y. Yang, "Conducting polymer as transparent electric glue", Adv. Mater. 18, 2006, pp. 2141-2144, doi:10.1002/adma.200502475; A. M. Nardes et al., "Conductivity, work function, and environmental stability of PEDOT:PSS thin films treated with sorbitol", Org. Electron. 9, 2008, pp. 727-734, doi:10.1016/j.orgel.2008.05.006; F. Zhang et al., "Polymer Photovoltaic Cells with Conducting Polymer Anodes", Adv. Mater. 14, 2002, pp. 662-665, doi:10.1002/1521-4095(20020503)14:9<662::AID-ADMA662>3.0.CO; 2-N; K. Sun et al., "Review on application of PEDOTs and PEDOT:PSS in energy conversion and storage devices", J. Mater. Sci. Mater. Electron. 26, 2015, pp. 4438-4462, doi: 10.1007/s10854-015-2895-5; M. Makha et al., "A transparent, solvent-free laminated top electrode for perovskite solar cells", Sci. Technol. Adv. Mater., 2016, pp. 260-266, doi: 10.1080/14686996.2016.1176512; A. K. Havare et al., The performance of OLEDs based on sorbitol doped PEDOT: PSS, Synth. Met. 161, 2012, pp. 2734-2738, doi:10.1016/j.synthmet.2011.10.011; and J. Huang et al., "A semi-transparent plastic solar cell fabricated by a lamination process", Adv. Mater. 20, 2008, pp. 415-419, doi:10.1002/adma.200701101. In addition, WO 2016 146612 A1 discloses a combination of PEDOT:PSS and sorbitol as "conductivity improving agent" in the cathode of lithium-sulfur electrochemical cells.

However, for improved sensitivity, thick X-ray detection layers of more than 100 μm should be used. Using liquid phase application or vapor deposition, huge amounts of solvents are set free, as discussed above, and also surface roughness is difficult to control. The complete degassing of solvents is not only technically challenging, but also problematic from the viewpoints of health and environmental safety.

For producing improved X-ray detectors based on perovskite, the production of thicker detection layers containing perovskites using a soft sintering method has been proposed in WO 2016091600A1 and WO 2016091442 A1. DE 100225541 (WO 2016091600 A1) discloses a detecting layer on a substrate, preferably for X-ray radiation, containing two types of perovskite crystals, and WO 2016091442 A1 describes coated particle comprises two types of perovskite crystals, and a core comprising perovskite crystal that is coated with a semiconductor material.

Using such method, a layer stack for an X-ray detector (not shown as a pixelated detector, for clarity) as depicted in FIG. 1 can be produced.

The layer stack shown in FIG. 1 has a top electrode 1, on which an encapsulation 7 is provided. Below the top electrode 1 a top interlayer 2 is provided, and below this layer a direct conversion layer 3 as X-ray absorbing layer, which comprises a perovskite. Below the direct conversion layer 3 a bottom interlayer 4 is provided, and below of this layer a bottom electrode 5, which itself is on top of a substrate 6.

The deposition of thick perovskite layers (>100 m) on a variety of substrates (e.g. glass, polymeric foils, metal foils) or functional substrates (e.g. a-Si or indium gallium zinc oxide (IGZO) backplanes for TFT (thin film transistor) arrays on glass or flexible substrates) is problematic because the perovskite layer, which may be polycrystalline, does not adhere, or only poorly adheres, to the substrate itself. This makes it difficult to produce X-ray detection devices, and particularly pixelated devices, e.g. image sensors and flat panel X-Ray detectors, which have directly electrodes and circuitry on the substrate.

SUMMARY OF THE INVENTION

It is therefore an object of the invention to provide an X-ray detector of the above type in which there is a good adhesion between the direct conversion layer, i.e. the X-ray converting layer, containing at least one perovskite, and the electrodes thereof, e.g. a structured electrode, such as on a pixelated substrate (backplane). It is an object to provide such a detector wherein the direct conversion layer has a sufficient thickness and sufficient adhesion and preferably can be produced by a sintering technique, e.g. soft sintering, so that fabrication, particularly of large area detectors, on an industrial level can be facilitated.

The invention is based on the insight that sufficient adhesion between an electrode and a direct conversion layer can be achieved if an interlayer is provided that contains at least one specific adhesion promoting additive that does not have a negative impact on the function of the interlayer so that sufficient resolution and sensitivity can be maintained.

All additives used in the prior art literature focus on the increase in conductivity in order to have a polymeric electrode. The adhesion promotion is a collateral effect, which makes these electrodes suitable for lamination processes. In contrast, the present invention focuses on an adhesion promoting interlayer wherein an adhesion promoting additive increases the adhesion at the interface between a bottom electrode and a direct conversion layer, e.g. a thick (e.g. hundreds of μm) soft-sintered multi-crystalline perovskite layer. Such a highly resistive interlayer ensures efficient blocking features for reduced dark current and crosstalk between adjacent pixels in a pixelated detector.

A first aspect of the present invention concerns an X-ray detector having a top electrode, a direct conversion layer containing at least one perovskite, and a bottom electrode, and the X-ray detector additionally has an electron blocking interlayer containing an electron blocking material between the top electrode and the direct conversion layer or between the bottom electrode and the direct conversion layer and/or a hole blocking interlayer containing a hole blocking material between the bottom electrode and the direct conversion layer, or between the top electrode and the direct conversion layer. At least one of the electron blocking interlayer and the hole blocking interlayer contains an adhesion promoting additive selected from the group consisting of saccharides and derivatives thereof, amino resins, phenol resins, epoxy resins, natural resins, and acrylic based adhesives. The saccharides or derivatives thereof, if present, are preferably sugar or sugar alcohols, and more preferably are sorbitol, xylitol, or glucose. The amino resins, if present, are preferably urea formaldehyde resins or melamine resins. The phenol resins, if present, are preferably phenol formaldehyde resins. The epoxy resins, if present, are preferably solvent-free epoxy glue.

In addition, a method according to the invention for producing an X-ray detector includes providing a top electrode, providing a direct conversion layer containing at least one perovskite, providing a bottom electrode, and providing an electron blocking interlayer having an electron blocking material between the top electrode and the direct conversion layer or between the bottom electrode and the direct conversion layer and/or a hole blocking interlayer comprising a hole blocking material between the bottom electrode and the direct conversion layer or between the top electrode and the direct conversion layer, wherein at least one of the electron blocking interlayer and the hole blocking interlayer has an adhesion promoting additive selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; and/or acrylic based adhesives; is disclosed.

The X-ray detector of the present invention is produced by the inventive method of producing an X-ray detector.

DESCRIPTION OF THE PREFERRED EMBODIMENTS

Figure 1:
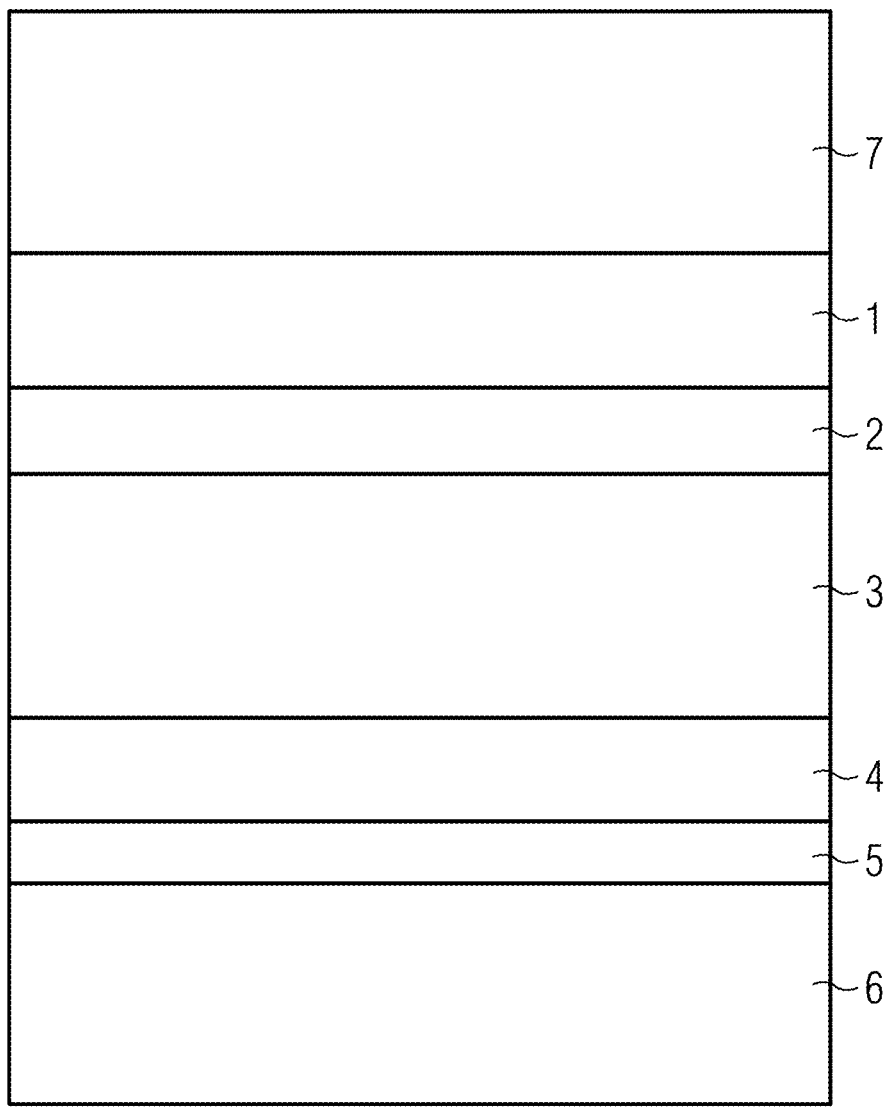
FIG. 1 schematically illustrates an X-ray detector based on semiconducting perovskites as X-ray converting layer in a direct conversion detector, according to the state of the art.

Unless defined otherwise, technical and scientific terms used herein have the meaning that is commonly understood by those of ordinary skill in the technology to which the present invention pertains.

Within the invention, sintering is a process wherein a material is compacted by the application of temperature and pressure.

In the present description, all numerical values relating to amounts are in wt. %, unless stated otherwise, or unless it is clear from that, that something else is intended.

Before the invention is described in exemplary detail, it is to be understood that this invention is not limited to the particular component parts of the process steps of the methods described herein as such methods may vary. It is also to be understood that the terminology used herein is for purposes of describing particular embodiments only, and is not intended to be limiting. It must be noted that, as used in the specification and the appended claims, the singular forms "a," "an" and "the" include singular and/or plural referents unless the context clearly dictates otherwise. For example, the term "a" as used herein can be understood as one single entity or in the meaning of "one or more" entities. It is also to be understood that plural forms include singular and/or plural referents unless the context clearly dictates otherwise. It is moreover to be understood that, when parameter ranges are given that are delimited by numeric values, the ranges are deemed to include these limitation values.

The present invention encompasses an X-ray detector, having a top electrode, a direct conversion layer containing at least one perovskite, and a bottom electrode.

The X-ray detector additionally has an electron blocking interlayer has an electron blocking material between the top electrode and the direct conversion layer or between the bottom electrode and the direct conversion layer, and/or a hole blocking interlayer containing a hole blocking material between the bottom electrode and the direct conversion layer, or between the top electrode and the direct conversion layer.

The X-ray detector additionally has an electron blocking interlayer containing an electron blocking material between the top electrode and the direct conversion layer or between the bottom electrode and the direct conversion layer and/or a hole blocking interlayer containing a hole blocking material between the bottom electrode and the direct conversion layer, or between the top electrode and the direct conversion layer. At least one of the electron blocking interlayer and the hole blocking interlayer contains an adhesion promoting additive selected from the group consisting of saccharides and derivatives thereof, amino resins, phenol resins, epoxy resins, natural resins, and acrylic based adhesives.

The saccharides or derivatives thereof, if present, are preferably sugar or sugar alcohols, and more preferably are sorbitol, xylitol, or glucose. The amino resins, if present, are preferably urea formaldehyde resins or melamine resins. The phenol resins, if present, are preferably phenol formaldehyde resins. The epoxy resins, if present, are preferably solvent-free epoxy glue. At least one of the electron blocking interlayer and the hole blocking interlayer contains an adhesion promoting additive selected from the group consisting of sugars and derivatives thereof, and amino resins, and phenol resins.

In the present X-ray detector the bottom and top electrode are not particularly restricted and can be suitably used as the anode or the cathode. According to different embodiments, the top electrode and/or bottom electrode is a conductive metal oxide, a polymer, or a metal. The bottom electrode can also be structured in the present X-ray detector, thus forming a pixelated X-ray detector. The pixel size may of course vary and may be derived from a pixel pitch of 98 µm of a square pixel, thus defining one pixel.

Furthermore, the direct conversion layer is not particularly restricted if it contains at least one perovskite and can directly convert X-rays, as described above. It can consist essentially of at least one perovskite—apart from unavoidable impurities, i.e. it can be a perovskite direct conversion layer. According to other embodiments, the direct conversion layer consists of at least one perovskite. In the direct conversion layer, mixtures of two or more perovskites can be present. According to certain embodiments, the at least one perovskite is crystalline. According to certain embodiments, the direct conversion layer is a multi-crystalline perovskite layer.

The at least one perovskite therein is not particularly restricted as long as it can convert X-rays. According to certain embodiments, the at least one perovskite is a semiconductor. It can be an organo-metallic and/or purely inorganic perovskite, as well as a mixture of two or more of those. For example, the perovskite can be at least one of the following, wherein MA denotes $[CH_3NH_3]^+$, methylammonium, and FA denotes formamidinium, $[HC(NH_2)_2]^+$, etc.: $MAPbI_3$ $(CH_3NH_3PbI_3)$, $MAPbBr3$ $(CH_3NH_3PbBr_3)$, $FAPI_3(HC(NH_2)_2I_3)$, $MAPbIC_{12}$ $(CH_3NH_3PbIC_{12})$, $FAPbBr_3$ $(HC(NH_2)_2Br_3)$, $EAPbI_3$ $(CH_3CH_2NH_3PbI_3)$, $PAPbI_3$ $(CH_3CH_2CH_2NH_3PbI_3)$, $BA_2PbI_4$ $((CH_3CH_2CH_2CH_2NH_3)_2PbI_4)$, $PMA_2PbI_4$ $((C_6H_5CH_2NH_3)_2PbI_4)$, $PEA_2PbI_4$ $((C_6H_5CH_2CH_2NH_3)_2PbI_4)$, $EAPbBr$ $(CH_3CH_2NH_3PbBr_3)$, $PAPbBr_3$ $(CH_3CH_2CH_2NH_3PbBr_3)$, an organic halogenated mixture of the above wherein I is partially or totally substituted by Cl and or Br, e.g. where $I_3$ is replaced by formula $I_{3-x}Cl_x$ or $Br_{3-x}Cl_x$, with x being an integer between 1 and 3, e. g. $MAPbI_{3-x}Cl_x$ or $CH_3NH_3PbBr_{3-x}Cl_x$, an organic perovskite where Pb is substituted by Sn, Cu, Ni, Bi, Co, Fe, Mn, Cr, Cd, Ge and/or Yb, an inorganic perovskite or mixtures thereof, e.g. of formula $CsPbX_3$ (X=Cl, Br, I, as well as a mixture of the three halogens), $Cs_3Bi_2X_9$ (X=Cl, Br, I, as well as a mixture of the three halogens), $Cs_3Sb_2X_9$ (X=Cl, Br, I, as well as a mixture of the three halogens), $Rb_3Bi_2X_9$ (X=Cl, Br, I, as well as a mixture of the three halogens), $Rb_3Sb_2X_9$ (X=Cl, Br, I, as well as a mixture of the three halogens), $CsSnI_3$.

According to certain embodiments, the direct conversion layer has a thickness of at least 50 µm, preferably at least 100 µm, more preferably more than 100 µm. According to certain embodiments, the direct conversion layer has a thickness of up to 2000 µm, e.g. up to 1500 µm, e.g. up to 1000 µm.

According to certain embodiments the direct conversion layer is produced by sintering of a detection material comprising or consisting essentially of perovskite powder.

The perovskite powder is not particularly restricted in this regard. According to certain embodiments, the perovskite powder is crystalline, i.e. consists of perovskite crystals. According to certain embodiments, the crystalline powder has an average particle size of 1-10 µm. According to certain embodiments, the crystals in the perovskite powder have a particle size of essentially 1-10 µm, wherein the particle size preferably is the average crystal diameter. The size of the crystals thereby can be determined by a suitable measurement method like scanning electron microscopy. According to certain embodiments, deviations from the average crystal diameter in every direction is less than 50% compared to the crystal diameter.

According to certain embodiments, sintering is carried out at a temperature between −100° C. and 300° C., preferably between −20 and 200° C., further preferably between 0 and 180° C., further preferably between 10 and 100° C., even further preferably between 20 and 80° C., even further preferably between 30 and 80° C., and/or at a pressure between 10 and 1000 MPa, preferably between 10 and 600 MPa, further preferably between 20 and 400 MPa, further preferably between 30 and 350 MPA, even further preferably between 100 and 340 MPa. According to certain embodiments, sintering is carried out at a pressure p of 10<p<1000 MPa, preferably 10<p<600 MPa, preferably 20<p<400 MPa, more preferably 30<p<350 MPa, even more preferably 100<p<340 MPa, and/or a temperature T of −100° C.<T<300° C., preferably −20<T<200° C., preferably 0<T<180° C., more preferably 10<T<100° C., even more preferably 20<T<80° C., even more preferably 30<T<80° C. The application of temperature and pressure therein is not particularly restricted, and can be suitably carried out, e.g. as described in WO 2016091600A1 and WO 2016091442 A1, which are incorporated by reference with regard to sintering.

According to certain embodiments, the micrometric perovskite powder with a particle size of 1-10 μm is pressed at a pressure of 10<p<600 MPa and temperature −100° C.<T<300° C. in the sintering method, which thus can also be termed a soft-sintering method. With this method, thick perovskite layers as direct conversion layers with a thickness of >100 μm can be produced.

The present X-ray detector additionally has an electron blocking interlayer containing an electron blocking material between the top electrode and the direct conversion layer or between the bottom electrode and the direct conversion layer and/or a hole blocking interlayer comprising a hole blocking material between the bottom electrode and the direct conversion layer or between the top electrode and the direct conversion layer, wherein at least one of the electron blocking interlayer and the hole blocking interlayer comprises an adhesion promoting additive selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; natural resins; and/or acrylic based adhesives. This means that the present X-ray detector can additionally comprise an electron blocking interlayer—comprising an electron blocking material, a hole blocking interlayer—comprising a hole blocking material, or both. When both an electron and a hole blocking interlayer are present, at least one of the two interlayers comprises an adhesion promoting additive selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; natural resins; and/or acrylic based adhesives, or both comprise an adhesion promoting additive. Of course, also mixtures of two or more adhesion promoting additives can be present in the electron blocking interlayer and/or the hole blocking interlayer. Furthermore, it is also possible that the electron blocking interlayer and/or the hole blocking interlayer essentially consists of the electron blocking material and/or the hole blocking material and the adhesion promoting additive—wherein according to certain embodiments solvent residues and/or impurities can remain, or a second interlayer essentially consists of the electron blocking material and/or the hole blocking material—again with possible solvent residues and/or impurities, if it is present, and the first layer comprises the adhesion promoting additive.

Thus, according to certain embodiments, the present X-ray detectors can comprise the following layers, particularly in this order: an optional substrate; bottom electrode; electron blocking interlayer or hole blocking interlayer essentially consisting of an electron blocking material or a hole blocking material and an adhesion promoting additive; direct conversion layer comprising or essentially consisting of at least one perovskite; optional hole blocking interlayer or electron blocking interlayer consisting essentially of a hole blocking material or an electron blocking material and optionally an adhesion promoting additive; top electrode; and an optional encapsulation.

If an adhesion promoting additive is present in an electron blocking layer and a hole blocking layer, the adhesion promoting additive in the electron blocking interlayer can be the same as the additive in the hole blocking interlayer, or can be different. By suitably applying the electron blocking interlayer and the hole blocking interlayer, a standard or inverted architecture can be realized for the present X-ray detector.

Preferably at least an adhesion promoting additive is present in the interlayer in contact with the bottom electrode. In this regard it is to be noted that at the beginning both the bottom and top electrode are not yet limited with regard to their function in the present X-ray detector, so that the distinction is only particularly of importance if one electrode is present on a further layer, e.g. a substrate.

In a hole blocking interlayer, the hole blocking material is not particularly restricted. Possible hole blocking materials include, for example, fullerene derivatives like C60 PCBM-[6,6]-phenyl C61 butyric acid methyl ester, C70 PCBM-[6,6]-phenyl C71 butyric acid methyl ester, bis-C60 PCBM-bis-[6,6]-phenyl C61 butyric acid methyl ester, OQDM-o-quinodimethane C60 monoadduct, bis-OQDM-o-quinodimethane C60 bisadduct), ICMA—indene C60 monoadduct, ICBA-indene C60 bisadduct, fullerol-C60(OH)44; and other acceptors, e.g. polymeric and small molecules, like dithienoindacene-based compounds like 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC), and IDTBR, perylenediimide (PDI)-based compounds like TPB, SdiPDI-Se, NIDCS-HO, diketopyrrolopyrrole (DPP)-based compounds like DPP6, DTDfBT(TDPP)2, SF(DPPB)4, PFN (poly[(9,9-bis(3'-(N,N-dimethylamino)-propyl)-2,7-fluorene)-alt-2,7-(9,9-dioctylfluorene)]), PFN-OX (poly[9,9-bis(60-(N,N-diethylamino)propyl)-fluorene-alt-9,9-bis-(3-ethyl(oxetane-3-ethyloxy)-hexyl)-fluorene]), PFO (poly(9,9-di-n-octylfluorenyl-2,7-diyl)), PPDIDTT (poly {[N,N'-bis(2-decyl-tetradecyl)-3,4,9,10-perylenediimide-1,7-diyl]-alt-(dithieno[3,2-b:2',3'-d]thiophene-2,6-diyl)}), 1,3,5-Tris(N-phenylbenzimidazol-2-yl)benzene (TPBi), etc., as well as mixtures and isomeric mixtures thereof.

Further, in an electron blocking interlayer, the electron blocking material is also not particularly restricted. Possible electron blocking materials include, for example PEDOT (Poly-3,4-ethylendioxythiophen) and derivatives like PEDOT:PSS (poly(3,4-ethylenedioxythiophene):poly(styrene-sulfonate)), poly(3-hexylthiophen-2,5-diyl) (P3HT), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MDMO-PPV), cyano-polyphenylene vinylene (CN-PPV), cyano-MEH-PPV (CN-MEH-PPV), other phthalocyanines, poly[(9,9-di-n-octylfluorenyl-2,7-diyl)-alt-(benzo[2,1,3] thiadiazol-4,8-diyl)] (F8BT), polyfluorene (PFO), poly[2,1,3-benzothiadiazole-4,7-diyl[4,4-bis(2-ethylhexyl)-4H-cyclopenta[2,1-b:3,4b']-dithiophene-2,6-diyl]] (PCPDTBT), squaraines—e.g. hydrazone end-capped symmetric squaraine with glycolic functionalization or diazulenesquaraine), polythieno[3,4-b]thiophene (PTT), poly(5,7- bis(4-decanyl-2-thienyl)-thieno(3,4-b)diathiazole-thiophene-2,5) (PDDTT), diketopyrrolopyrrole-based polymers like poly{2,2[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophen-2,5-diyl} (PDPP3T), poly[[2,5-bis(2-hexyldecyl-2,3,5,6-tetrahydro-3,6-dioxopyrrolo[3,4c]pyrrole-1,4-diyl]-alt-[3',3"-dimethyl-2,2':5',2"-terthiophene]-5,5"-diyl] (PMDPP3T) and poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-terthiophen-2,5-diyl} (PDPP5T), poly [2,6-4,8-di(5-ethylhexylthienyl)benzo[1,2a-b;3,4-b]dithiophene-alt-5-dibutyloctyl-3,6-bis(5-bromothiophen-2-yl) pyrrolo[3,4-c]pyrrole-1,4-dione] (PBDTT-DPP), dithienosilole-based polymers like poly[(4,4-bis(2-ethylhexyl)dithieno[3,2-b:2',3'-d]silole)-2,6-diyl-alt-(4,7-bis(2-thienyl)-2,1,3-benzothiadiazole)-5,5'-diyl] (PSBTBT), 7,7'-(4,4-bis(2-ethylhexyl)-4H-silolo[3,2-b:4,5-b']dithiophene-2,6-diyl)bis (6-fluoro-4-(5'-hexyl-[2,2'-bithiophen]-5-yl)benzo[c][1,2,5] thiadiazole) (p-DTS(FBTTh2)2), poly[2,7-(9,9-dioctyl-dibenzosilole)-alt-4,7-bis(thiophen-2-yl)benzo-2,1,3-thiadiazole] (PSiFDTBT), benzodithiophene-based polymers like poly[4,8-bis[(2-ethylhexyl)oxy]benzo[1,2-b:4,5-b']dithiophene-2,6-diyl-alt-3-fluoro-2-[(2-ethylhexyl)carbonyl] thieno[3,4-b]thiophene-4,6-diyl] (PTB7), poly[(2,6-(4,8-bis (5-(2-ethylhexyl)thiophen-2-yl)-benzo[1,2-b:4,5-b']dithiophene))-alt-(5,5-(1',3'-di-2-thienyl-5',7'-bis(2-ethylhexyl) benzo[1',2'-c:4',5'-c']dithiophene-4,8-dione))]) (PBDB-T), poly{2,6'-4,8-di(5-ethylhexylthienyl)benzo[1,2-b;3,4-b]dithiophene-alt-5-dibutyloctyl-3,6-bis(5-bromothiophen-2-yl) pyrrolo[3,4-c]pyrrole-1,4-dione} (PBDTT-DPP), poly[4,8-bis(5-(2-ethylhexyl)thiophen-2-yl)benzo[1,2-b;4,5-b'] dithiophene-2,6-diyl-alt-(4-(2-ethylhexyl)-3-fluorothieno[3,4-b]thiophene-)-2-carboxylate-2-6-diyl)] (PBDTT-FTTE), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene-)-2-6-diyl)] (PBDTTT-C-F), PolyB enzoThiadiaZol (Thiophene)-stat-BenzoDiThiophene(Thiophene)-8 (PBT-ZT-stat-BDTT-8) and other polymers, co-polymers and small molecules with an absorption maximum between 320-800 nm, polytriarylamines and derivatives, poly[[2,5-bis(2-octyldo-decyl)-2,3,5,6-tetrahydro-3,6-dioxopyrrolo[3,4-c]pyrrole-1,4-diyl]-alt2[[2,2'-(2,5-thiophene)bisthieno[3,2-b]thiophen]-5,5'-diyl]] (DPP(P)), polyaniline (PANI), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene)-2-6-diyl)] (PBDTTT-C), poly[N29-hepta-decanyl-2,7-carbazole-alt-3,6-bis-(thiophen-5-yl)-2,5-dioctyl-2,5-dihydropyrrolo[3,4-]pyrrole-1,4-dione] (PCBTDPP), poly[[9-(1-octylnonyl)-9H-carbazole-2,7-diyl]-2,5-thiophenediyl-2,1,3-benzothiadiazole-4,7-diyl-2,5-thiophenediyl] (PCD-TBT), poly[2,5-bis(2-octyldodecyl)pyrrolo[3,4-c]pyrrole-1,4(2H,5H)-dione-(E)-1,2-di(2,2'-bithiophen-5-yl)ethene] (PDPPDBTE), poly(tetrafluoroethylene-perfluoro-3,6-dioxa-4-methyl-7-octene-sulfonic acid) (PFI), poly(4-styrene sulfonate)-graft-polyaniline (PSS-g-PANI), PTB-DCB21 (2'-butyloctyl-4,6-dibromo-3-fluorothieno[3,4-b]thiophene-2-carboxylate (TT-BO), 3',4'-dichlorobenzyl-4,6-dibromo-3-fluorothieno-[3,4-b]thiophene-2-carboxylate (TT-DCB) and 2,6-bis(trimethyl-tin)-4,8-bis(2-ethylhexyloxy)benzo[1,2-b:4,5-b']dithiophene (BDT-EH) copolymer), N2,N2,N2',N2',N7,N7,N7',N7'-octakis(4-methoxyphenyl)-9,9'-spirobi [9H-fluorene]-2,2',7,7'-tetramine (spiro-OMeTAD), poly[(9,9-dioctylfluorenyl-2,7-diyl)-co-(4,4'-(N-(4-sec-butylphenyl)diphenylamine)] (TFB), N4,N4'-di(naphthalen-1-yl)-N4,N4'-bis(4-vinylphenyl)biphenyl-4,4'-diamine (VNPB), PhNa-1T (hole-transport material based on 1,4-bis(4-sulfonatobutoxy)benzene and thiophene moieties), as well as mixtures thereof, e.g. binary, ternary, quaternary blends etc.

In addition, the adhesion promoting additive that is present in at least one of the interlayers is selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; natural resins; and/or acrylic based adhesives. According to certain embodiments, the adhesion promoting additive that is present in at least one of the interlayers is selected from sugars and/or derivatives thereof, preferably sugars and/or sugar alcohols, further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; natural resins; and/or acrylic based adhesives. According to certain embodiments, the adhesion promoting additive that is present in at least one of the interlayers is selected from sugars and/or derivatives thereof, preferably sugars and/or sugar alcohols, further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; and/or acrylic based adhesives. According to certain embodiments, the adhesion promoting additive that is present in at least one of the interlayers is selected from sugars and/or derivatives thereof, preferably sugars and/or sugar alcohols, further preferably sorbitol, xylitol, glucose; and/or from amino resins, preferably urea formaldehyde resins and/or melamine resins; phenol resins, preferably phenol formaldehyde resins; and/or epoxy resins, preferably solvent-free epoxy glue. According to certain embodiments, the adhesion promoting additive that is present in at least one of the interlayers is selected from sugars and/or derivatives thereof, preferably sugars and/or sugar alcohols, further preferably sorbitol, xylitol, glucose. According to certain embodiments, the adhesion promoting additive that is present in at least one of the interlayers is selected from amino resins, preferably urea formaldehyde resins and/or melamine resins; phenol resins, preferably phenol formaldehyde resins; and/or epoxy resins, preferably solvent-free epoxy glue. According to certain embodiments, the adhesion promoting additive that is present in at least one of the interlayers is selected from urea formaldehyde resins and/or melamine resins; phenol formaldehyde resins; and/or epoxy resins, preferably solvent-free epoxy glue. According to certain embodiments, the adhesion promoting additive that is present in at least one of the interlayers is selected from urea formaldehyde resins and/or melamine resins; phenol formaldehyde resins; and/or solvent-free epoxy glue. With these additives it can be ensured that the resistivity of the interlayer is not lowered too much so that optical cross-talk can be minimized, while at the same time a sufficient adhesion enhancement to the direct conversion layer can be achieved.

A saccharide comprises sugars as well as polysaccharides, e.g. starch and/or cellulose. A sugar within the invention is a carbohydrate selected from monosaccharides, disaccharides and oligosaccharides with between three and ten monosaccharide units. Examples thereof, include for monosaccharides e.g. trioses, tetroses, pentoses, hexoses, heptoses, e.g. hexoses, e.g. glucose, fructose, fucose, galactose, mannose, lactose, maltose, sucrose, lactulose, trehalose, cellobiose, chitobiose, etc. According to certain embodiments, the sugar is a pentose and/or hexose.

A derivative of a saccharide is a compound derived from a saccharide, i.e. a compound having a saccharide scaffold, and can comprise derivatives of sugars; and/or derivatives of polysaccharides, e.g. derivatives of starch and/or cellulose, wherein one or more hydroxy groups and/or aldehyde groups can be replaced by a suitable functional group like an amino group, a carbonyl group, a carboxy group, an aldehyde group (not in case of replacing an aldehyde group), a hydroxyl group (not in case of replacing a hydroxyl group), an ether group or a carbonate ester group, wherein in an ester, carbonyl or ether group an alkyl residue with 1 to 20 carbon atoms, e.g. 1 to 10 carbon atoms, e.g. 1 to 4 carbon atoms can be present. A sugar derivative is a compound derived from a sugar, i.e. a compound with a sugar scaffold, e.g. in the case of sugar alcohols, that can be cyclic or non-cyclic, wherein one or more hydroxy groups and/or one or more aldehyde groups can be replaced by a suitable functional group like an amino group, a carbonyl group, a carboxy group, an aldehyde group (not in case of replacing an aldehyde group), a hydroxyl group (not in case of replacing a hydroxyl group), an ether group or a carbonate ester group, wherein in an ester, carbonyl or ether group an alkyl residue with 1 to 20 carbon atoms, e.g. 1 to 10 carbon atoms, e.g. 1 to 4 carbon atoms can be present.

Sugar alcohols are polyols that are structurally derived from carbohydrates, particularly sugars. Examples thereof are e.g. glycerol, erithrytol, threitol, arabitol, xylitol, ribitol, mannitol, sorbitol, galacitol, fucitol, iditol, inositoll, volemitol, isomalt, maltitol, lactitol, maltotriol, polyglycitol, etc. According to certain embodiments, non-cyclic sugar alcohols are applied as adhesion promoting additive. According to certain embodiments, the sugar alcohol is derived from a pentose and/or a hexose. A preferable sugar alcohol is sorbitol, which is a preferred adhesion promoting additive.

A natural resin is a resin that is present in nature, e.g. amber, and is not particularly restricted. Also, the amino resin, preferably urea formaldehyde resin and/or melamine resin; phenol resin, preferably phenol formaldehyde resin; epoxy resin, preferably solvent-free epoxy glue; and/or acrylic based adhesive is not particularly restricted.

Thus, according to certain embodiments, in case the adhesion promoting additive in at least one of the interlayers is selected from sugars and/or derivatives thereof, it is selected from pentoses and/or hexoses and/or sugar alcohols derived from pentoses and/or hexoses.

Therefore, according to certain embodiments, the adhesion promoting additive in at least one of the interlayers is selected from pentoses and/or hexoses and/or sugar alcohols derived from pentoses and/or hexoses, and/or from amino resins, preferably urea formaldehyde resins and/or melamine resins; phenol resins, preferably phenol formaldehyde resins; epoxy resins, preferably solvent-free epoxy glue; and/or acrylic based adhesives.

More than one adhesion promoting additive can be present in the respective interlayer. According to certain embodiments, one adhesion promoting additive is present in the electron blocking interlayer and/or hole blocking interlayer.

According to certain embodiments, the adhesion promoting additive is selected from sorbitol, xylitol, glucose, urea-formaldehyde, acrylic based adhesive, e.g. an acrylic based adhesive as disclosed in D. Bryant et al., "A transparent conductive adhesive laminate electrode for high-efficiency organic-inorganic lead halide perovskite solar cells, Adv. Mat. 26, 2014, pp. 7499-7504 (DOI: 10.100$^2$/adma.201403939) or in http://en.lascaux.ch/lascaux.ch/pdf/en/produkte/restauro/58370.02_Adhesive_and_Adhesive_Wa x.pdf, and/or solvent free epoxy glue.

According to certain embodiments, the adhesion promoting additive is contained in the electron blocking interlayer and/or hole blocking interlayer in an amount ranging from 0.3 to 97.5 wt. %, preferably from 1.5 to 90 wt. %, further preferably between 3 and 79 wt. %, even further preferably between 3 and 72 wt. %, particularly preferably between 20 and 65 wt. %, based on the total weight of the respective electron blocking interlayer and/or hole blocking interlayer. It can be spread in the interlayer homogeneously or inhomogeneously, preferably homogeneously.

Below a content of 0.3 wt. % of the adhesion promoting additive in the interlayer it is difficult to obtain an adhesion improvement. On the hand, when over 97.5 wt. % of adhesion promoting additive is contained, it is difficult to obtain a homogeneous interlayer.

According to certain embodiments, the specific resistance of the adhesion promoting additive at 20° C. is >$10^4$ Ohm·cm, preferably >$10^6$ Ohm·cm, more preferably >$10^8$ Ohm·cm.

According to certain embodiments, the electron blocking interlayer and/or the hole blocking interlayer, particularly comprising the adhesion promoting additive selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; natural resins; and/or acrylic based adhesives, has a resistivity of >$1\times10^2$ Ohm·cm, preferably >$1\times10^3$ Ohm·cm, further preferably >$1\times10^4$ Ohm·cm, even further preferably $5\times10^4$ Ohm·cm.

The X-ray detector of the present invention can further comprise a substrate on which the bottom electrode is applied and which is not particularly restricted. It can be e.g. made of glass, a polymeric film and/or a metal. The material of the substrate can depend on e.g. a device to be produced.

Also, for better mechanical stability, a carrier layer can be provided, on which a substrate can be provided, and/or for protection of the X-ray detector, an encapsulation can be provided, both of which also are not particularly restricted.

Furthermore, electric connections and functional elements like thin film transistors can be provided in the X-ray detector, as well as other components usually used in such a detector. For example, using an active transistor matrix and structured electrodes, pixelated sensors, e.g. X-ray image sensors, can be provided.

In addition, further layers can be present which can be present in X-ray detectors of the state of the art.

Figure 2:
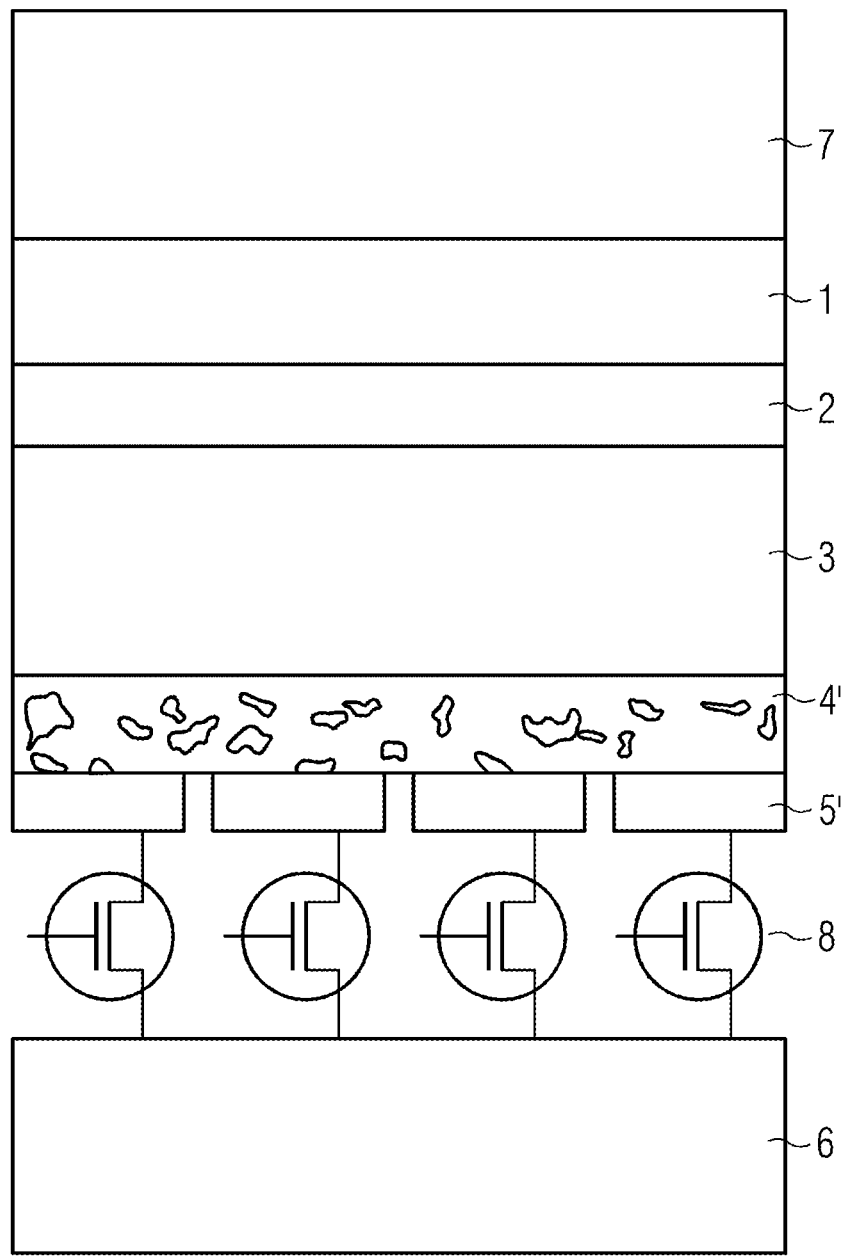
FIG. 2 shows schematically illustrates a layer stack in an X-ray detector, such as an X-ray image sensor/X-ray imager, of the present invention comprising an interlayer, having an adhesion promoting additive.

An exemplary layer stack for an X-ray detector, e.g. an X-ray imager, according to the invention with an adhesion promoting interlayer is schematically shown in FIG. 2.

In FIG. 2 thin film transistors (TFTs) 8 as active matrix driving scheme are provided on a substrate 6. On top of the TFTs 8 structured bottom electrodes 5' are provided to enable pixelated detection. On top of the pixelated bottom electrodes 5' a bottom interlayer 4', e.g. a hole blocking interlayer or electron blocking interlayer, containing an adhesion promoting additive is provided. In the bottom interlayer 4' the adhesion promoting additive is shown to be contained inhomogeneously for better viewing, but of course preferably it is distributed homogeneously in the interlayer. On top of the bottom interlayer 4' a direct conversion layer 3 comprising a perovskite is present, and on top thereof a top interlayer 2, e.g. an electron blocking interlayer or a hole blocking interlayer. This top interlayer 2 can also be absent or also can comprise an adhesion promoting additive (not shown). On top of the top interlayer 2 the top electrode 1 is provided, on which an optional encapsulation 7 is provided.

According to certain embodiments, the present X-ray detector is a digital flat panel X-ray detector. According to certain embodiments, the present invention relates to an X-Ray detector using semiconducting perovskites in a direct converting layer or as direct converting layer, preferably a pixelated flat panel X-Ray detector using semiconducting perovskites in a direct converting layer or as direct converting layer.

In addition, a method according to the invention for producing an X-ray detector includes providing a top electrode, providing a direct conversion layer containing at least one perovskite, providing a bottom electrode, and providing an electron blocking interlayer having an electron blocking material between the top electrode and the direct conversion layer or between the bottom electrode and the direct conversion layer and/or a hole blocking interlayer comprising a hole blocking material between the bottom electrode and the direct conversion layer or between the top electrode and the direct conversion layer, wherein at least one of the electron blocking interlayer and the hole blocking interlayer has an adhesion promoting additive selected from saccharides and/or derivatives thereof, preferably sugars and/or derivatives thereof, further preferably sugars and/or sugar alcohols, even further preferably sorbitol, xylitol, glucose; and/or from amino resins, preferably urea formaldehyde resins and/or melamine resins; phenol resins, preferably phenol formaldehyde resins; epoxy resins, preferably solvent-free epoxy glue; and/or acrylic based adhesives; is disclosed.

With this method, the present X-ray detector can be produced. Therefore, the description of features with regard to the present X-ray detector applies also to the same features with regard to the present method, and vice versa.

The materials of the top and/or bottom electrode, the interlayer(s), as well as also the adhesion promoting additive, can be the same as discussed with regard to the present X-ray detector. According to certain embodiments, the top electrode and/or bottom electrode comprises a conductive metal oxide, a polymer, and/or a metal.

According to certain embodiments, the applying of the hole blocking layer comprising the hole blocking material and the adhesion promoting additive or of the electron blocking interlayer comprising the electron blocking material and the adhesion promoting additive on top of the bottom electrode is carried using a solution or suspension comprising the hole blocking material and the adhesion promoting additive, or using a solution or suspension comprising the electron blocking material and the adhesion promoting additive. Of course application by another way may also be possible, but application from solution or suspension is preferred. According to certain embodiments, the solution or suspension is cast on the bottom electrode, e.g. being on top of a substrate, with a classical solution or suspension processable method. The application from solution or suspension is thus not particularly restricted, and can be done e.g. by spin-coating, slit-dye coating, doctor-blading, gravure printing, screen-printing, or spray-coating, etc., all of which are not particularly restricted.

The solution or suspension of the electron or hole blocking material and the adhesion promoting additive is not particularly limited, and a suitable solvent can be used, e.g. depending on the electron or hole blocking material and the adhesion promoting additive. For preparing the solution or suspension, the adhesion promoting material and the electron or hole blocking material can be dissolved in a suitable solvent, or the adhesion promoting material can be added or admixed to a solution or suspension comprising the electron or hole blocking material, etc. According to certain embodiments, the adhesion promoting additive is dissolved together with the electron blocking material or hole blocking material in the same solvent.

The solvent can be e.g. water or an organic solvent, e.g. an alcohol like methanol, ethanol, etc., an alkane like propane, hexane, etc. an ether like dimethyl ether, diethyl ether, THF, an ester like ethyl acetate, etc., or a mixture thereof, and is not particularly restricted. Also the concentration in the solvent is not particularly restricted and can be suitably set according to the concentration of the electron or hole blocking material and the adhesion promoting additive in the respective interlayer. Of course, if a further interlayer is present without an adhesion promoting additive, this can also be applied from solution or suspension, but can also be applied in a different way, e.g. from the gas phase, e.g. PCV, etc. Also the electron or hole blocking interlayer comprising the adhesion promoting additive can be applied on top of the direct conversion layer.

Figure 3:
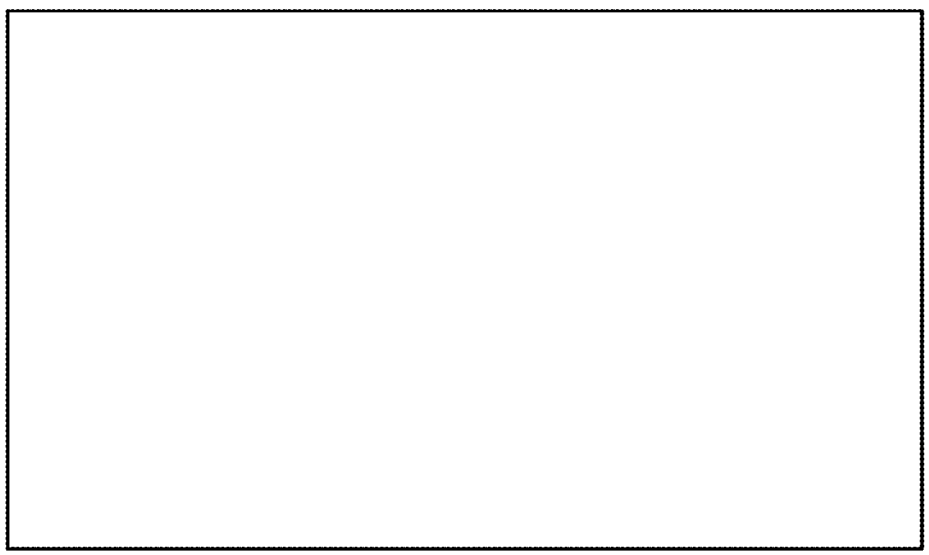
FIG. 3 is a schematic illustration of high resistive, interlayer without an adhesion promoting additive.
Figure 4:
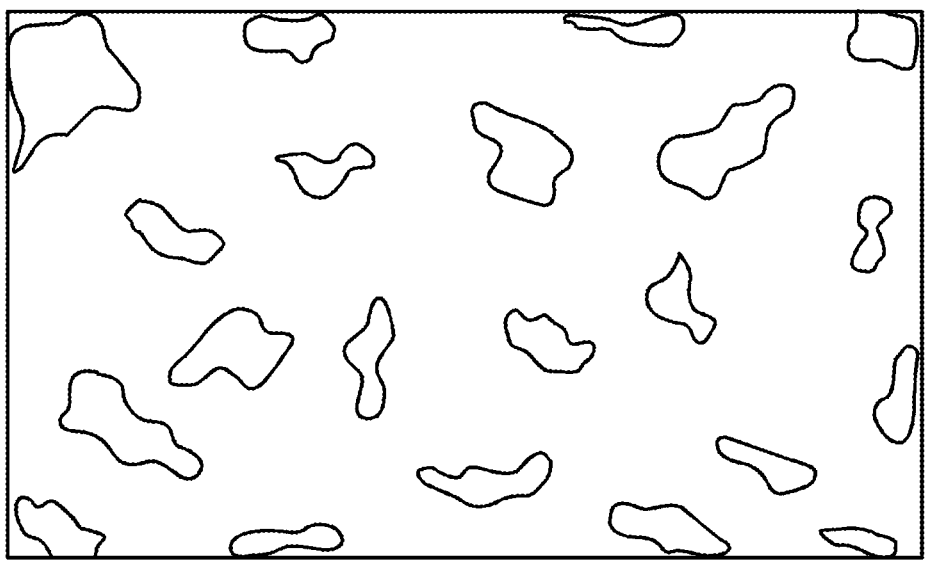
FIG. 4 schematically illustrates a high resistive, interlayer with an adhesion promoting additive.

According to certain embodiments, the adhesion promoting additive is contained in the electron blocking interlayer and/or hole blocking interlayer in an amount ranging from 0.3 to 97.5 wt. %, preferably from 1.5 to 90 wt. %, further preferably between 3 and 79 wt. %, even further preferably between 3 and 72 wt. %, particularly preferably between 20 and 65 wt. %, based on the total weight of the respective electron blocking interlayer and/or hole blocking interlayer. As stated before, the adhesion promoting additive can be distributed in the interlayer homogeneously or inhomogeneously. An observed exemplary inhomogeneous distribution is shown schematically in FIG. 4, which is contrasted to an interlayer containing no adhesion promoting additive in FIG. 3. FIGS. 3 and 4 are schematic representations of a, particularly high resistive, bottom interlayer without and with an adhesion promoting additive, e.g. PEDOT:PSS and PEDOT:PSS+sorbitol. As discussed before, the adhesion promoting additive acts as adhesion promoting material, while the blocking material acts as charge injection blocking material.

As the adhesion promoting additive is present in at least the bottom interlayer, a sintering, e.g. soft-sintering of perovskite containing powders (e.g. micro-crystalline) can be done directly interlayer and even on a backplane containing a bottom electrode and optionally a substrate even on large areas from few mm$^2$ to few thousands cm$^2$ with good adhesion and homogeneity. For example, flat-panel X-ray detectors with a size of 43×43 cm$^2$ can be produced.

With regard to the bottom interlayer, it can be decided whether an electron blocking interlayer or a hole blocking interlayer is applied depending on the architecture of the device itself (standard or inverted) and the envisioned driving polarity.

After the application of the solution or suspension comprising the hole blocking material and the adhesion promoting additive, or the solution or suspension comprising the electron blocking material and the adhesion promoting additive, optionally the formed hole blocking interlayer or electron blocking interlayer comprising the adhesion promoting additive can be dried, e.g. at elevated temperature. For example, thermal evaporation, e.g. co-evaporation, of the electron blocking interlayer or the hole blocking interlayer comprising the adhesion promoting additive is possible for the formation of an adhesion promoting interlayer. The interlayer can be also annealed, e.g. also on top of the bottom electrode, an optional substrate, etc. at a suitable temperature and for a suitable time, depending e.g. on the adhesion promoting additive and the electron and/or hole blocking material, as well as a solvent used. According to certain embodiments, annealing is carried out at a temperature equal to or lower than the boiling point of the solvent used. According to certain embodiments, the annealing is carried out at a temperature of 100° C. or less. Higher temperatures can lead to a higher conductivity in the interlayer, and thus to a higher crosstalk. Furthermore, annealing can be carried out for a time of 15 minutes or less. Longer annealing times will also lead to an increased conductivity. Of course, also lower annealing temperatures and/or shorter annealing times are possible. Preferably annealing is carried out in an inert atmosphere which is not particularly restricted and which can be suitably set depending on the adhesion promoting additive and the electron and/or hole blocking material.

According to certain embodiments the direct conversion layer is produced by sintering of a detection material comprising or consisting essentially of perovskite powder, which is not particularly restricted. The perovskite powder is not particularly restricted in this regard. According to certain embodiments, the perovskite powder is crystalline, i.e. consists of perovskite crystals. According to certain embodiments, the crystalline powder has an average particle size of 1-10 μm. According to certain embodiments, the crystals in the perovskite powder have a particle size of essentially 1-10 μm, wherein the particle size preferably is the average crystal diameter. The size of the crystals thereby can be determined by a suitable measurement method like scanning electron microscopy. According to certain embodiments, deviations from the average crystal diameter in every direction is less than 50% compared to the crystal diameter.

According to certain embodiments, sintering is carried out at a temperature between −100° C. and 300° C., preferably between −20 and 200° C., further preferably between 0 and 180° C., further preferably between 10 and 100° C., even further preferably between 20 and 80° C., even further preferably between 30 and 80° C., and/or at a pressure between 10 and 1000 MPa, preferably between 10 and 600 MPa, further preferably between 20 and 400 MPa, further preferably between 30 and 350 MPA, even further preferably between 100 and 340 MPa. According to certain embodiments, sintering is carried out at a pressure p of $10<p<1000$ MPa, preferably $10<p<600$ MPa, preferably $20<p<400$ MPa, more preferably $30<p<350$ MPa, even more preferably $100<p<340$ MPa, and/or a temperature T of $-100°$ C.$<T<300°$ C., preferably $-20<T<200°$ C., preferably $0<T<180°$ C., more preferably $10<T<100°$ C., even more preferably $20<T<80°$ C., even more preferably $30<T<80°$ C. If the temperature of the soft sintering is too high, the perovskite can decompose. If the temperature is too low, the linear thermal expansion coefficient of the perovskite and/or a phase transition of the perovskite can add stress to the layer stack and e.g. make it not compatible any more, e.g. to a substrate. For example, the linear thermal expansion coefficient of MAPbI is $43*10^{-6}$ $K^{-1}$, which is 16 times higher than that of Si and 5 times higher than that of glass. If the pressure is too low, no compact pellet can be obtained, and if the pressure is too high, a bottom electrode and/or even a substrate that is present may be deformed or break, e.g. a glass substrate, especially with passive electronics of a backplane (TFTs, wire connectors).

The application of temperature and pressure therein is not particularly restricted, and can be suitably carried out, e.g. as described in WO 2016091600A1 and WO 2016091442 A1, which are incorporated by reference with regard to sintering.

According to certain embodiments, the direct conversion layer is produced to have a thickness of at least 50 μm, preferably at least 100 μm, more preferably more than 100 μm. According to certain embodiments, the direct conversion layer is produced to have a thickness of up to 2000 μm, e.g. up to 1500 μm, e.g. up to 1000 μm.

It is also possible to sinter an already compacted direct conversion layer, e.g. a perovskite layer, which already underwent a sintering process on top of an interlayer comprising the adhesion promoting additive, e.g. sinter it with the adhesion promoting interlayer coated on top of an electrode on top of a substrate.

Further, a substrate on which the bottom electrode is applied and which is not particularly restricted, e.g. made of glass, a polymeric film and/or a metal, can be suitably applied in the present method, e.g. below the bottom electrode, or the bottom electrode can be applied on a substrate. The material of the substrate can depend on e.g. a device to be produced.

Also, for better mechanical stability, a carrier layer can be provided, on which a substrate can be provided, and/or for protection of the X-ray detector, an encapsulation can be provided, both of which also are not particularly restricted.

Furthermore, electric connections and functional elements like thin film transistors can be provided in the present method, as well as other components usually used in an X-ray detector. For example, using an active transistor matrix and structured electrodes, pixelated sensors, e.g. X-ray image sensors, can be provided.

The above embodiments can be combined arbitrarily, if appropriate. Further possible embodiments and implementations of the invention comprise also combinations of features not explicitly mentioned in the foregoing or in the following with regard to the Examples of the invention. Particularly, a person skilled in the art will also add individual aspects as improvements or additions to the respective basic form of the invention.

EXAMPLES

The present invention will now be described in detail with reference to several examples thereof. However, these examples are illustrative and do not limit the scope of the invention.

Example 1 (Reference Example)

In a first reference example, resistance measurements of an interlayer containing an adhesion promoting additive were tested to determine optimal contents thereof to obtain a sufficient resistivity in the interlayer.

For the resistance measurement, a two point measurement was carried out with a SMU Keithley 2400 source meter between two separated evaporated silver electrodes with a thickness of about 100 nm, between which an interlayer with a thickness of about 120 nm was applied by spin-coating. The interlayer was produced from mixtures of a PEDOT suspension in water (PEDOT: CLEVIOS™ P VP CH 8000 (Heraeus Deutschland GmbH & Co. KG)) with variable amounts of sorbiol (D-sorbitol, BioUltra, ≥99.5% (HPLC) (Sigma Aldrich)), with the amounts given in Table 1. In Table 1, the concentration of the sorbitol (in wt. %) is given with regard to the PEDOT dispersion (in water, solid content of PEDOT/PSS ~2.4-3 wt. %). After the application, the produced interlayer was annealed at 100° C. for 15 minutes.

Figure 5:
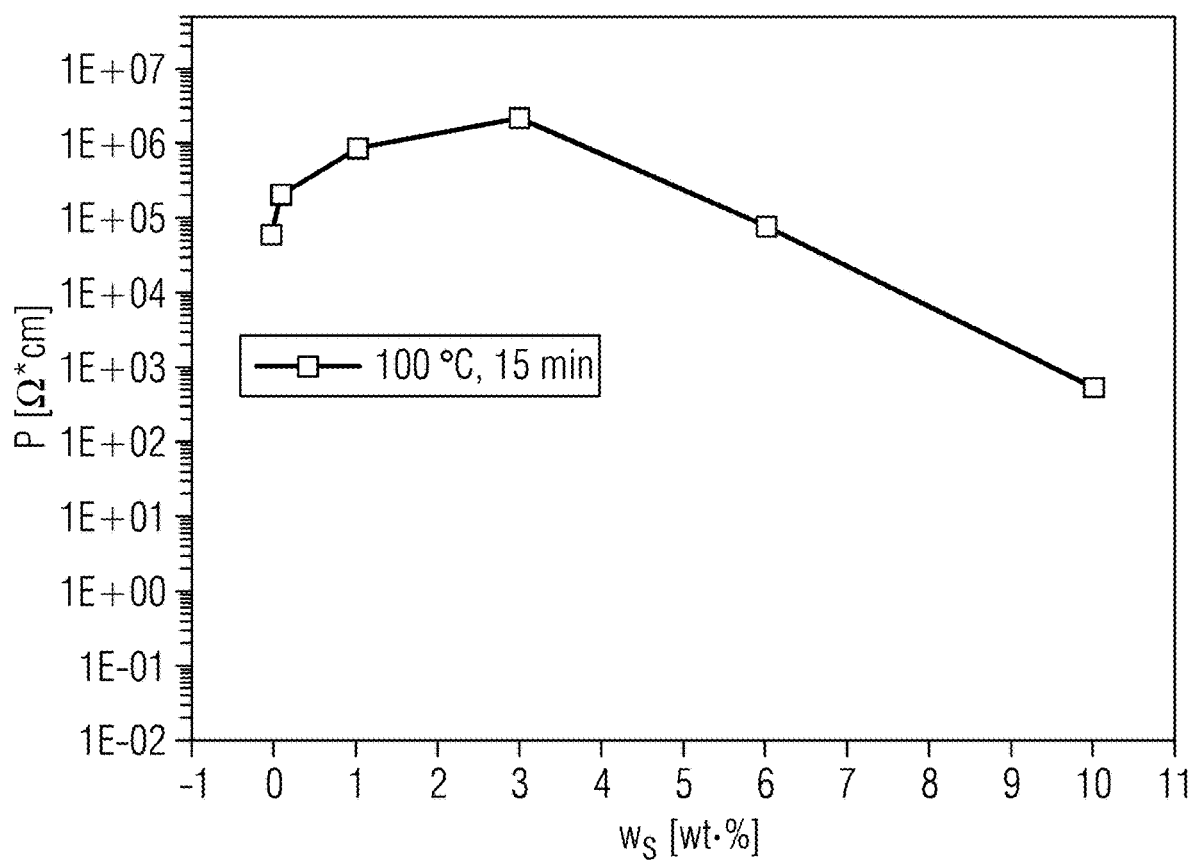
FIG. 5 shows a measurement of the specific resistance of a mixture of PEDOT and sorbitol at different concentrations of sorbitol used in the present examples.

The measurements were carried out in a glovebox under inert atmosphere. The geometry of the interlayer was as follows: width 3 cm, length 2 cm, height ~120 nm. Results of the measurements are shown in Table 1 and FIG. 5.

TABLE 1

Results of Example 1

| Sample | Sorbitol Content $w_s$ [wt %] | Resistance R @ 100 V [Ω] | Resistivity P [Ω*cm] |
|---|---|---|---|
| 0 | 0 | 3.47G | 6.23E+04 |
| 1 | 0.1 | 11.6G | 2.04E+05 |
| 2 | 1 | 41.6G | 8.66E+05 |
| 3 | 3 | 110 . . . 300G | 2.21E+06 |
| 4 | 6 | 3.69G | 7.57E+04 |
| 5 | 10 | 23.1M | 5.19E+02 |

Example 2 (Reference)

With the interlayer of sample 3 of Example 1 a layer stack was produced on a 0.7 mm thick glass substrate with 256×256 a-Si TFTs and a 100 nm ITO bottom electrode per pixel, on which the interlayer of sample 3 was applied as in Example 1.

Figure 6:
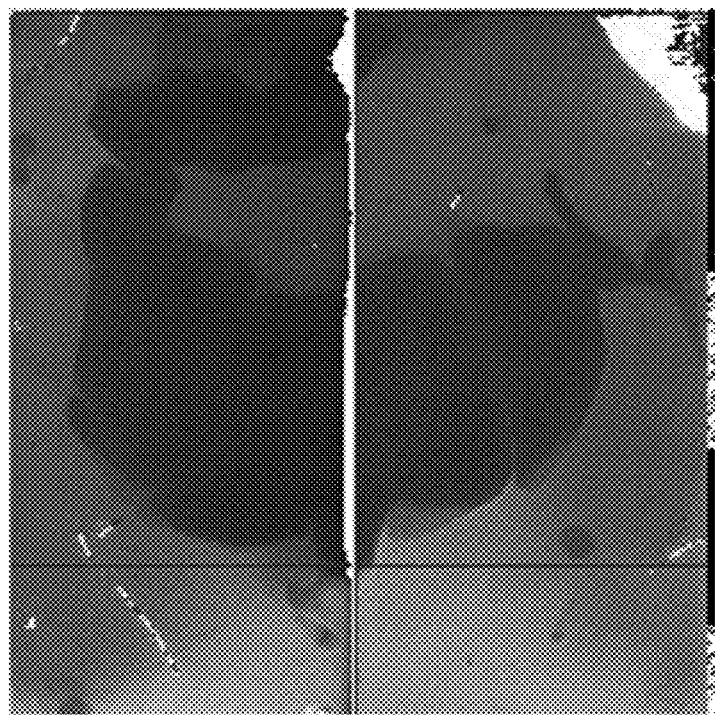
FIG. 6 is a recorded dark image obtained using an embodiment of a perovskite-based X-ray detector of the present invention.

On top thereof a direct conversion layer was produced by soft sintering (pressure 330 MPa, T=70° C., 30 minutes, in inert atmosphere N2, thickness ~400 m, particle size ~1-3 μm) MAPI (256×256 pixels). As a comparative example, the same layer stack was produced with sample 0 of Example 1 as interlayer—without sorbitol. After the sintering, dark images of the produced stacks were recorded using a custom made readout electronics based on the ISC9717 Readout chip (ROIC) from Flir; voltage applied to the perovskite layer 10V, ROIC feedback capacitor 2 pF, correlated double sampling gain 1×, integration time ~20 ms. Images have been strongly windowed (gain correction) to see the noise pattern. The results of the stack with the interlayer without sorbitol are shown in FIG. 6, and the results with the interlayer with sorbitol in FIG. 7.

Figure 7:
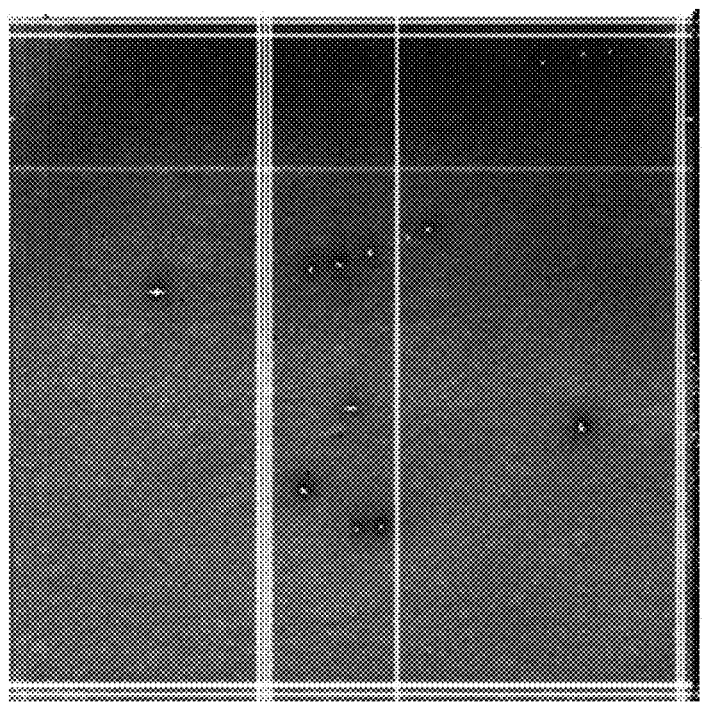
FIG. 7 shows a dark image obtained using an embodiment of a perovskite-based X-ray detector of the present invention.

The difference in adhesion is clear. In FIG. 7 the entire surface of the imager is contacted with good adhesion of the direct conversion layer (apart of a few defective small areas), while in the FIG. 6 only the darker zones are in contact with the substrate and bottom electrode. In FIGS. 6 and 7, also defective lines and columns due to defective bonding can be seen, which are artifacts of the production process and do not negatively influence the results.

Example 3 and Example 4

X-ray detectors (256×256 pixels, pixel pitch 98 μm, gap between adjacent pixels 14 μm) have been produced as in Example 2, with an additional gold top electrode on the direct conversion layer and a laminated aluminum/PET barrier tape (TESA Barrier tape 61570) as encapsulation, one with a bottom interlayer with high resistivity (Ex. 3 same device as Example 2) and one with a bottom interlayer with lower resistivity (Ex. 4; same parameters as for Example 2 but $W_s$=10; i.e. sample 5 of Example 1 as bottom interlayer).

With the detectors, the modulation transfer function MTF was measured in dependence of the line pair 1p. Measurements were thereby done according to the slanted edge method and evaluated with imageJ.

Figure 8:
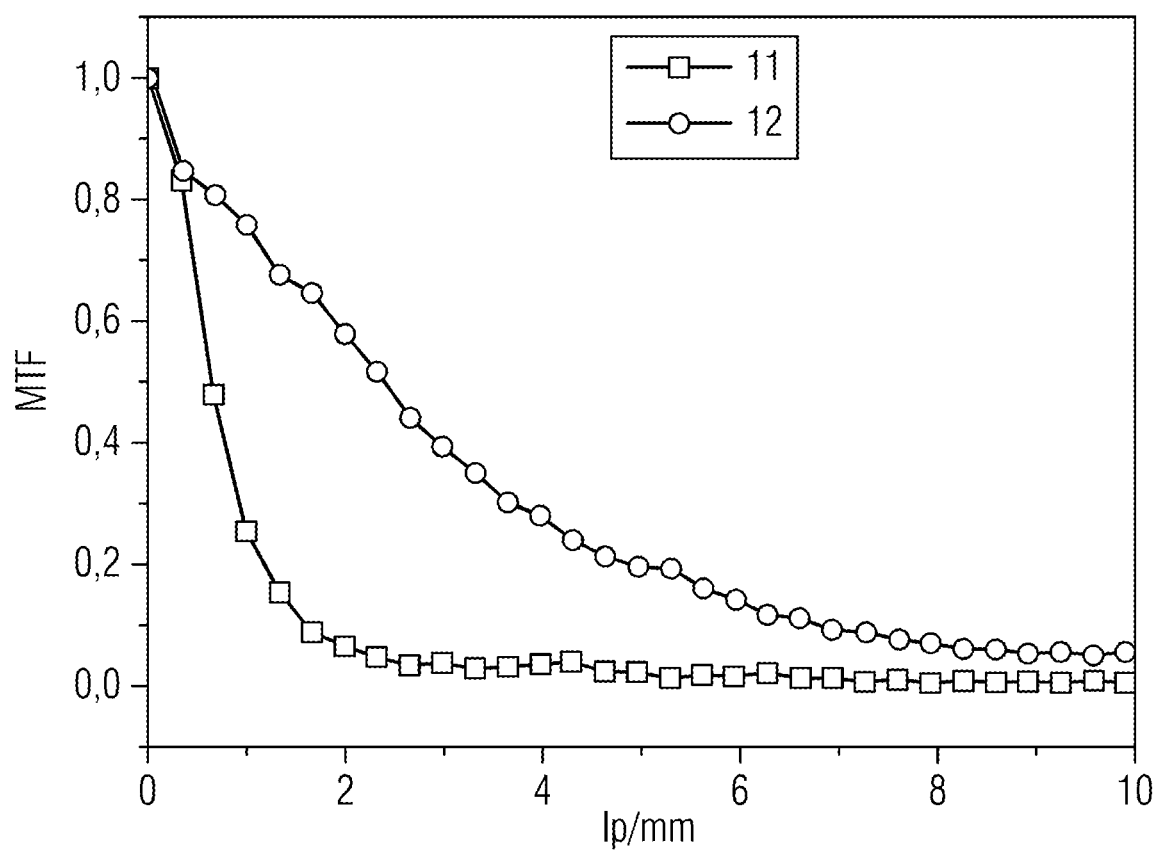
FIG. 8 shows the results of the modulation transfer function of an exemplary X-ray image sensor having a high and low resistivity interlayer.

The results thereof are shown in FIG. 8, with the results with the interlayer with low resistivity shown with reference number 11 and the results with the interlayer with high resistivity with reference number 12. As seen in FIG. 8, the resolution of the imager degrades drastically with the reduction of the resistivity of the interlayer.

Example 5

An X-ray detector was produced in the same way as in Example 3, wherein the bottom interlayer was exchanged with one comprising regioregular P3HT from Rieke Metals and epoxy (Vitralit 1605 from Panacol) with a content of P3HT of 1 wt. % in the bottom interlayer, produced from a chlorobenzene solution. Similar results were obtained as in Example 3.

With the present invention, the use of engineered formulations of interlayer solutions or dispersions for the fabrication of X-ray detectors, particularly image sensors (pixelated detectors) based on soft-sintering of perovskite containing direct conversion layers, particularly from μ-crystalline powders, is provided. An improved adhesion of the perovskite containing active layer leads to homogeneous photo-detection, opening the way for application on an industrial level for the fabrication of image sensors and flat panel X-Ray detectors.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An X-ray detector comprising:
   a top electrode;
   a bottom electrode;
   a direct conversion layer between said top electrode and said bottom electrode, said direct conversion layer comprising at least one perovskite; and
   a blocking interlayer disposed at a location including at least one of (i) between said top electrode and said direct conversion layer, and (ii) between said bottom electrode and said direction conversion layer,
   wherein said blocking interlayer comprises an adhesion promoting additive and a material including at least one of an electron blocking material and a hole blocking material,
   wherein said adhesion promoting additive at includes at least one of saccharides and derivatives thereof, amino resins, phenol resins, epoxy resins, natural resins, and acrylic based adhesives, and
   wherein said blocking interlayer, which includes a combination of the adhesion promoting additive and the at least one of the electron blocking material and the hole blocking material, has a resistivity that is greater than $10^4$ ohm·cm.

2. An X-ray detector as claimed in claim 1, wherein said adhesion promoting additive is a saccharide or a derivative including at least one of sugars and sugar alcohols.

3. An X-ray detector as claimed in claim 1, wherein said adhesion promoting additive is a saccharide or a derivative thereof selected from the group consisting of sorbitol, xylitol and glucose.

4. An X-ray detector as claimed in claim 1, wherein said adhesion promoting additive is at least one amino resin including at least one of urea formaldehyde resins and melamine resins.

5. An X-ray detector as claimed in claim 1, wherein said adhesion promoting additive is a phenol resin.

6. An X-ray detector as claimed in claim 1, wherein said adhesion promoting additive is an epoxy resin.

7. An X-ray detector as claimed in claim 1, wherein said direct conversion layer has a thickness of more than 100 micrometers.

8. An X-ray detector as claimed in claim 1, wherein said direct conversion layer comprises sintered perovskite powder.

9. An X-ray detector as claimed in claim 1, wherein said adhesion promoting additive is contained in said blocking interlayer in an amount including at least one of 0.3 to 97.5 wt. %, 1.5 to 90 wt. %, and 3 to 79 wt. %, based on a total weight of the blocking interlayer.

10. An X-ray detector as claimed in claim 1, wherein at least one of said top electrode and said bottom electrode comprises at least one of metal oxides, polymers, and metals.

11. An X-ray detector as claimed in claim 1, wherein said bottom electrode includes a plurality of pixelated electrodes that form a pixelated detector.

12. A method for producing an X-ray detector, comprising:
    providing a top electrode and a bottom electrode and a direct conversion layer between said top electrode and said bottom electrode, said direct conversion layer comprising at least one perovskite;
    providing a blocking interlayer at a location including at least one of (i) between said top electrode and said direct conversion layer, and (ii) between said bottom electrode and said direction conversion layer;
    forming said blocking interlayer comprising an adhesion promoting additive and a material including at least one of an electron blocking material and a hole blocking material; and
    selecting said adhesion promoting additive including at least one of saccharides and derivatives thereof, amino resins, phenol resins, epoxy resins, natural resins, and acrylic based adhesives,
    wherein said blocking interlayer, which includes a combination of the adhesion promoting additive and the at least one of the electron blocking material and the hole blocking material, has a resistivity that is greater than $10^4$ ohm·cm.

13. A method as claimed in claim 12, comprising:
    selecting said adhesion promoting additive as a saccharide or a derivative thereof including at least one of sugars and sugar alcohols.

14. A method as claimed in claim 12, comprising:
    selecting said adhesion promoting additive as a saccharide or a derivative thereof including at least one of sorbitol, xylitol, and glucose.

15. A method as claimed in claim 12, comprising:
    selecting said adhesion promoting additive as at least one amino resins including at least one of urea formaldehyde resins and melamine resins.

16. A method as claimed in claim 12, comprising:
    selecting said adhesion promoting additive as a phenol resin.

17. A method as claimed in claim 12, wherein said adhesion promoting additive is an epoxy resin.

18. A method as claimed in claim 12, comprising:
    providing said direct conversion layer with a thickness of more than 100 micrometers.

19. A method as claimed in claim 12, comprising:
    forming said direct conversion layer by sintering perovskite powder.

20. A method as claimed in claim 12, comprising:
    including said adhesion promoting additive in said blocking interlayer in an amount including at least one of 0.3 to 97.5 wt. %, 1.5 to 90 wt. %, and 3 to 79 wt. %, based on a total weight of the blocking interlayer.

21. A method as claimed in claim 12, comprising:
    forming at least one of said top electrode and said bottom electrode so as to contain at least one of metal oxides, polymers, and metals.

22. A method as claimed in claim 12, comprising:
    applying the blocking interlayer at the location between said direct conversion layer and said bottom electrode using a solution or suspension comprising the blocking material and the adhesion promoting additive by a procedure including at least one of spin-coating, slit-dye coating, doctor-blading, gravure printing, screen-printing, and spray-coating.

23. An X-ray detector as claimed in claim 11, wherein the resistivity of the blocking interlayer reduces dark current and crosstalk between adjacent pixels from among the plurality of pixelated electrodes that form the pixelated detector.

* * * * *